(12) United States Patent  
Sakamoto et al.

(10) Patent No.: US 7,332,808 B2  
(45) Date of Patent: Feb. 19, 2008

(54) SEMICONDUCTOR MODULE AND METHOD OF MANUFACTURING THE SAME

(75) Inventors: Noriaki Sakamoto, Gunma (JP); Chikara Kaneta, Saitama (JP); Yoshihiko Yanase, Gunma (JP); Yoshiyuki Kobayashi, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 11/393,531

(22) Filed: Mar. 29, 2006

(65) Prior Publication Data

US 2006/0220189 A1    Oct. 5, 2006

(30) Foreign Application Priority Data

Mar. 30, 2005    (JP)    ............................ P2005-097601

(51) Int. Cl.
    *H01L 23/34*    (2006.01)
(52) U.S. Cl. .................. 257/723; 257/685; 257/777; 257/787; 257/E25.01; 257/E25.011; 257/E25.015; 257/E25.022; 257/E25.023
(58) Field of Classification Search ................ 257/666, 257/684, 685, 686, 706, 712, 713, E23.087, 257/E23.101, E23.11, 723, 777, E25.006, 257/E25.013, E25.018, E25.021, E25.027, 257/E23.085, E21.614; 438/109, FOR. 368, 438/FOR. 426

See application file for complete search history.

(56) References Cited

U.S. PATENT DOCUMENTS

| | | | |
|---|---|---|---|
| 6,271,581 B2 * | 8/2001 | Huang et al. ................ 257/666 |
| 6,498,053 B2 * | 12/2002 | Mastromatteo et al. ..... 438/107 |
| 6,690,089 B2 * | 2/2004 | Uchida ........................ 257/686 |
| 6,921,980 B2 * | 7/2005 | Nakanishi et al. ........... 257/784 |
| 7,030,494 B2 * | 4/2006 | Aoki ............................ 257/758 |
| 7,102,225 B2 * | 9/2006 | Khan et al. .................. 257/706 |
| 7,129,583 B2 * | 10/2006 | Tao et al. ..................... 257/777 |
| 7,161,239 B2 * | 1/2007 | Zhao et al. ................... 257/707 |
| 7,180,175 B2 * | 2/2007 | Zhou et al. ................... 257/707 |
| 2003/0224581 A1 * | 12/2003 | Lutz et al. .................... 438/455 |
| 2005/0056920 A1 * | 3/2005 | Li et al. ........................ 257/686 |
| 2005/0253240 A1 * | 11/2005 | Nuechter et al. ............ 257/686 |

FOREIGN PATENT DOCUMENTS

JP    2004-63618    2/2004

* cited by examiner

*Primary Examiner*—Jasmine Clark
(74) *Attorney, Agent, or Firm*—Fish & Richardson P.C.

(57) ABSTRACT

A semiconductor module according to the invention includes: an island formed of a conductive material; a plurality of leads disposed in vicinity of the island; a resin sealing body which is mounted on the island and disposed such that a back surface of a circuit board on which semiconductor elements is exposed upward; a sensor which is mounted on the back surface of the circuit board; and a thin metallic wire which electrically connects the circuit board with the leads. The island, the resin sealing body, the sensor, and parts of the leads are sealed by a second sealing resin.

9 Claims, 7 Drawing Sheets

SEMICONDUCTOR MODULE AND METHOD OF MANUFACTURING THE SAME

Priority is claimed to Japanese Patent Application Number JP2005-97601 filed on Mar. 30, 2005, the disclosure of which is incorporated herein by reference in its entirety.

BACKGROUND OF THE INVENTION

1. Field of the Invention

The present invention relates to a semiconductor module and a method of manufacturing the same, and more particularly to a semiconductor module, which has semiconductor elements and the like mounted on both surfaces of a substrate, and is highly reliable, and a method of manufacturing the same.

2. Description of the Related Art

Referring now to FIGS. 7A to 7C, a method of manufacturing a conventional double-sided surface mount type circuit module is described.

Referring to FIG. 7A, a circuit board 101 is first prepared, which includes a substrate 102 having a first conductive pattern 103 which is formed on the front surface thereof and a second conductive pattern 104 which is formed on the back surface thereof.

Referring to FIG. 7B, a first semiconductor element 105 is mounted on the first conductive pattern 103, and second semiconductor elements 106 are mounted on the second conductive pattern 104. At this time, devices for mounting the semiconductor elements are mounted above and beneath the circuit board 101. The first and second semiconductor elements 105 and 106, respectively, are mounted substantially at the same time.

Referring to FIG. 7C, the first and second semiconductor elements 105 and 106, respectively, are electrically connected with the conductive patterns via thin metallic wires 108A and 108B, respectively, to form an electric circuit. Furthermore, after making a resin seal using an insulative resin, the electric circuit is separated into predetermined shapes to manufacture a double-sided surface mount circuit module. This technology is described for instance in Japanese Patent Application Publication No. 2004-63618.

However, there have been following problems with the method of manufacturing the circuit module described above.

For example, in a case where wire bonding of the first semiconductor element 106 is performed after wire bonding of second semiconductor elements 105, it becomes necessary to prevent the thin metallic wires 108A from being brought into contact with the outside, and therefore the handling work is difficult.

Morever, it was impossible to inspect the semiconductor element as a single unit and all functions thereof after the semiconductor elements were mounted on both surfaces of the circuit board 101. Thus, it is difficult to find out the cause of the failure occurring in the circuit module. Therefore, the highly reliable circuit module cannot be provided.

Furthermore, if a joint of the first semiconductor element 105 fails to work, a second semiconductor element 106 without any problems has been wasted because the second semiconductor element 106 is mounted together with the first one. Accordingly, if the second semiconductor element 106 is, for example, an expensive sensor, this results in an increase in a manufacturing cost.

Moreover, in recent years, thin type packages, called an SIP and a CSP have become available in the market. In particular, the SIP is of a type called a stacked type which is formed by stacking a plurality of chips in a vertical direction, and, in other words, the SIP is of a two-dimensionally arranged type so as to allow a high-performance circuit to be incorporated into one package. However, there are problems of the thickness of a sealing resin, and the warpage of the substrate resulted from the high performance. For example, in a high temperature or humid atmosphere, there is a problem of diminishing the reliability.

SUMMARY OF THE INVENTION

The present invention is made taking the problems described above into consideration. It is a primary object of the invention to provide a highly reliable double-sided surface mount semiconductor module and a method of manufacturing the same.

The semiconductor module according to the invention comprises an island formed of a conductive material, a plurality of leads having one ends thereof being disposed in vicinity of the island, a resin sealing body which is mounted on the island and arranged such that a back surface of the circuit board on which the semiconductor element is mounted is facing upward, a sensor or a circuit element which is mounted on the back surface of the circuit board, and connecting means which electrically connects the circuit board with the lead, in which the island, the resin sealing body, the sensor or the circuit element, and the parts of the leads are sealed using a sealing resin.

Moreover, the semiconductor module according to the invention comprises a mounting board which has at least an external connection electrode and a pad electrode which is electrically connected with the external connection electrode, a resin sealing body which is disposed adjacent to the pad electrode of the mounting board and arranged such that a back surface of the circuit board on which the semiconductor elements are mounted is facing upward, a sensor or a circuit element which is electrically mounted on the back surface of the circuit board, connecting means which electrically connects an electrode exposed from the back surface of the circuit board with the pad electrode, a sealing resin which allows a back surface of the mounting board to be exposed, and seals a front surface of the mounting board, the resin sealing body, the sensor or the circuit element, and the connecting means.

A method of manufacturing a semiconductor module according to the invention comprises the steps of preparing a circuit board having at least a first wiring layer on a front surface thereof and a second wiring layer on a back surface thereof, mounting semiconductor elements on the first wiring layer, forming a resin sealing body by sealing the first wiring layer and the semiconductor elements using a first sealing resin, mounting a sensor or a circuit element on the second wiring layer, mounting the resin sealing body on a planar island such that the second wiring layer is exposed upward, electrically connecting the second wiring layer with the lead having one end thereof being disposed in vicinity of the island, and collectively sealing the lead, the resin sealing body, and the island with a second sealing resin such that part of the lead is exposed.

Furthermore, a method of manufacturing the semiconductor module according to the invention comprises the steps of preparing a circuit board having at least a first wiring layer on a front surface thereof, and a second wiring layer on a back surface thereof, mounting a semiconductor element on the first wiring layer, forming a resin sealing body by sealing the first wiring layer and the semiconductor element using a first sealing resin, mounting a sensor or a circuit element on the second wiring layer, mounting the resin sealing body on a mounting board such that the second wiring layer is exposed upward, electrically connecting the conductive patterns formed on the front surface of the mounting board with the second wiring layer of the resin sealing body, and collectively sealing the surfaces of the resin sealing body and the mounting board using the second sealing resin while the conductive pattern formed on the back surface of the mounting board is exposed.

Still further, the method of manufacturing the semiconductor module according to the invention comprises the steps of preparing a package in which at least semiconductor elements is sealed and an electrode is disposed on a back surface thereof, mounting a sensor or a circuit element on the electrode located on the back surface, mounting the package on a planar island, electrically connecting a lead having one end thereof being arranged in vicinity of the island with the package, and sealing the island, the one end of the lead, and the package.

DETAILED DESCRIPTION OF THE PREFERRED EMBODIMENTS

The concept of the embodiment of the present invention is to realize a high performance of the semiconductor module by double sealing a resin sealing body 15 using a second sealing resin 20 to make it possible for a thin type of the resin sealing body 15 to overcome a very bad environment and have a small size.

Figure 1A:
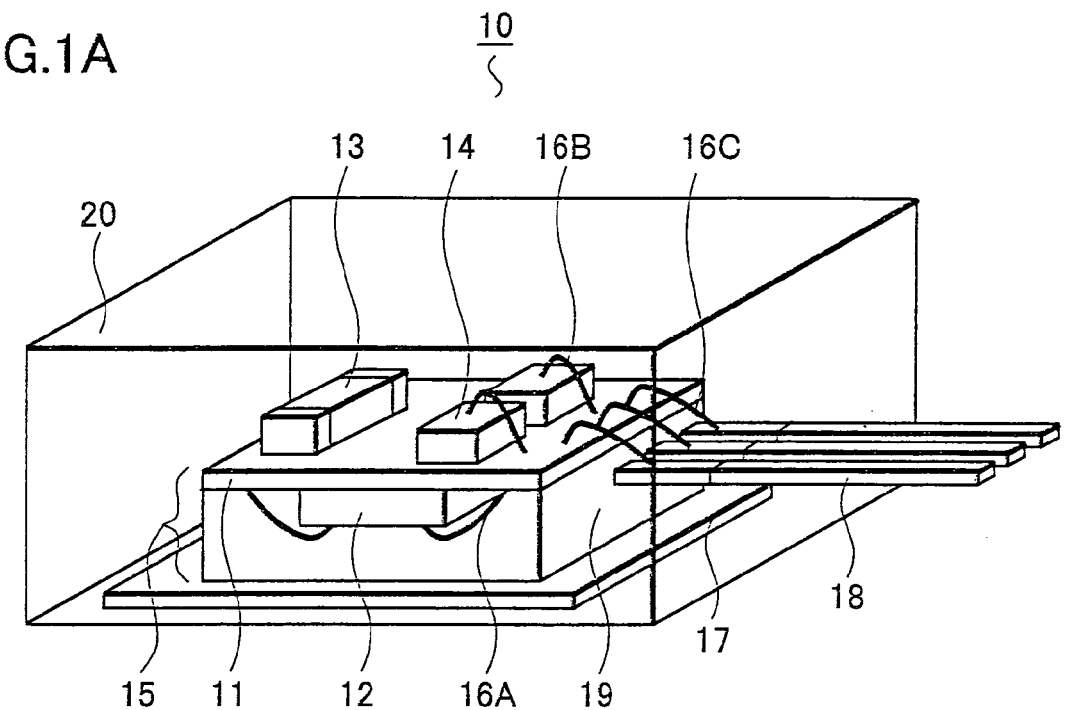
FIGS. 1A and 1B are views showing a semiconductor module according to embodiments of the present invention.

Referring to FIG. 1, a semiconductor module 10 according to the embodiment will be described.

The semiconductor module 10 according to the embodiment includes a circuit board 11 on which chips are mounted on both surfaces of the circuit board 11. A semiconductor element 12 located below the circuit board 11 is sealed by a first sealing resin 19 to be previously prepared as a package. The package is mounted on the top surface of an island 17 in a manner that the front surface thereof faces to the top surface of the island 17. Furthermore, a sensor chip 13 and a circuit element 14 are mounted on the backside of the package in a manner that the bottom surfaces thereof are facing to the backside of the package.

One ends of leads 18 are provided in vicinity of the island 17. The leads 18 are electrically connected with a pad electrode located on the circuit board 11 via thin metallic wires 16C. The second sealing resin 20 then seals the resin sealing body 15, the sensor chip 13 which is mounted above the circuit board 11, the island 17, and the leads 18 as a whole. The other ends of the leads 18 are exposed to exchange electric signals with the outside. Also, the back surface of the island 17 is exposed from the second sealing resin 20 to contribute to an improvement in heat releasing properties. The semiconductor element 12 is built in the resin sealing body 15, which is sealed by the second sealing resin 20. Accordingly, since the semiconductor element 12 is not susceptible to external influences, it is possible to improve the reliability of the semiconductor module. The leads 18 may be directly connected with the pad electrode mounted on the circuit board 11.

Although not shown in FIG. 1, the circuit board 11 includes a multi-layer wiring which is formed by stacking wiring layers via insulating layers and a first wiring layer is formed on the under surface of the circuit board 11 and a second wiring layer is formed on the top surface thereof In the embodiment, the multi-layer wiring will be described as having a two-layer structure, but as a matter of course, a structure of three layers or more may be used. The first and second wiring layers are made of a metallic material such as copper and electrically connected with each other via a joint described below. The first wiring layer includes a land on which the semiconductor element 12 is mounted, a pad which is connected with the electrode located on the semiconductor element 12, and wiring extending from the pad, each being formed in the first wiring layer. In the same manner, a land, a pad, and a wiring are also formed in the second wiring layer. A plating coating is at least formed at the point where wire bonding is carried out.

The semiconductor element 12 is electrically connected with the wiring located on the circuit board 11 via thin metallic wires 16A. In addition to the semiconductor element 12, circuit elements such as a chip resistor and a capacitor can be built in the resin sealing body 15. The embodiment employs an ASIC (Application Specific Integrated Circuit) which is an application-specialized IC as the semiconductor element 12. The semiconductor element 12 and the circuit element 14 may be mounted by a facedown method instead of using thin metallic wires.

The material of the first sealing resin 19 includes epoxy resin, polyimide resin, or polyphenylene sulfite. Thermosetting resins such as epoxy resin and thermoplastic resins such as polyimide resin and polyphenylene sulfite can be formed by transfer molding and injection molding, respectively. The first sealing resin 19 is formed so as to seal a electric circuit including the wiring located on the circuit board 11, the semiconductor element 12, and the thin metallic wires 16A.

In the embodiment, the sensor chip 13 (sensor) includes various sensors, and here, one which can be bonded using a brazing filler metal, a silver paste, or an adhesive is employed. Today, many small-sized sensors are available. In particular, a magnetoresistive element and a Hall element are employed and considered to be used as a sensor which detects displacement, transfer, and existence of an object such as a photosensor. The sensor chip 13 is mounted on the front surface of the circuit board 11 which is exposed from the resin sealing body 15. Specifically, a sensor which can detect displacement, transfer, pressure, gravity, earth magnetism, impact, temperature, velocity, acceleration, or angular velocity can be employed as the sensor chip 13.

The circuit element 14 is also mounted on the same surface as that on which the sensor chip 13 is mounted. The circuit element 14 includes a semiconductor element, a chip capacitor, and a chip resistor.

The island 17 and the leads 18 are made of Cu, an alloy using Cu as a main material, and Fe—Ni alloy and formed by punching out or etching a thin reed-shaped plate. The resin sealing body 15 is mounted on the island 17 such that the surface which is formed of the first sealing resin 19 is facing downward, and the first sealing resin 19 and the island 17 are in contact with each other. As shown in FIG. 1, the island 17 is formed to have a larger planar size than that of the resin sealing body 15 but may have a smaller planar size than that of the resin sealing body 15.

One ends of the leads 18 are provided in vicinity of the island 17 and electrically connected with the wiring of the circuit board 11 via the thin metallic wires 16C. The semiconductor module 10 exchanges electric signals with an outside via the leads 18. In the embodiment, the leads 18 are exposed from one side surface of the semiconductor module 10. However, it is possible to expose the leads 18 from a plurality of side surfaces.

The second sealing resin 20 allows the back surface of the island 17 and the part of the leads 18 to be exposed and seals the resin sealing body 15, the sensor chip 13 and the circuit element 14. The second sealing resin 20 is also fabricated by, for example, transfer molding or injection molding as described above. Moreover, potting or dipping may be used for sealing.

The semiconductor module 10 described above, is required to be down-sized including the size of the semiconductor element 12 which serves as a driving IC, and is often disposed in a very bad atmosphere conditions. These problems are solved through the processes of preparing a thin type package which includes, for example, a printed circuit board or a flexible board on which the semiconductor element 12 is mounted; mounting a sensor or a circuit element on the back surface of the package; and further sealing this using resin. Thus, the semiconductor element, which is a primary key device, is double sealed to have a considerably improved reliability.

Figure 1B:
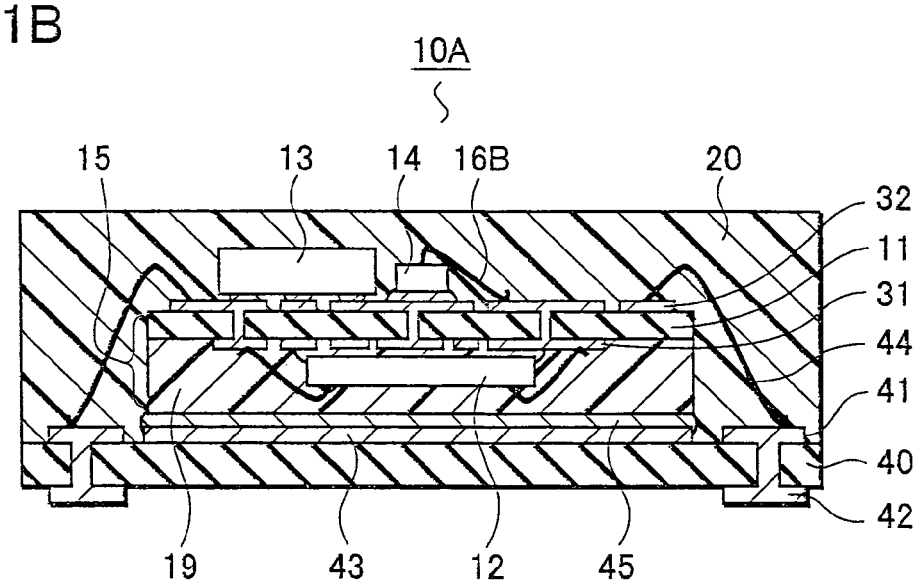

Referring to FIG. 1B, the configuration of a semiconductor module 10A of another embodiment is described. In the semiconductor module 10A, a mounting board 40 serves a role corresponding to the roles of the island 17 and the leads 18 in the semiconductor module 10 described above. Specifically, although the resin sealing body 15 is mounted on the top surface of the island 17 in the semiconductor module 10 described above, the resin sealing body 15 is mounted on the top surface of the mounting board 40. Furthermore, conductive patterns formed on the back surface of the mounting board 40 functions as external connecting means in the present embodiment. The other configurations of the semiconductor module 10A are basically the same as that of the semiconductor module 10.

The semiconductor module 10A mainly includes: the mounting board 40 which has a first and second conductive patterns 41 and 42 which are formed on the top and under surfaces thereof, respectively; the resin sealing body 15 mounted on the top surface of the mounting board 40; a sensor chip 13 or a circuit element 14 connected on the top surface of the resin sealing body 15; and a second sealing resin 20 formed so as to seal the resin sealing body 15 and the like.

The mounting board 40 is constituted of ceramic, resin, metal, and the like. Specifically, for example, a printed circuit board, and flexible sheet can be employed. The first and second conductive patters 41 and 42 are formed on the front and back surfaces of the mounting board, respectively. In the embodiment, the planar size of the mounting board 40 is equal to that of the second sealing resin 20, but might be larger or smaller than that of the sealing resin 20. Furthermore, when metallic materials including aluminum, copper and the like are employed as the material of the mounting board 40, the top and under surfaces of the mounting board 40 are covered with an insulating layer.

The first conductive patterns 41 is made of a conductive material such as copper and the like and formed on the top surface of the mounting board 40 in a predetermined pattern. Furthermore, the first conductive pattern 41 includes a land pattern 43 of a land shape, a plurality of bonding pads arranged around the land pattern 43, and wirings which connect a pad with another pad.

The second conductive pattern 42 is formed on the back surface of the mounting board 40 in a predetermined pattern, and passes through the predetermined point of the mounting board 40 to be connected with the first conductive pattern 41. The second conductive pattern 42 functions as connecting means (external connection electrode) with an outside. As necessary, a solder electrode may be deposited on the back surface of the second conductive pattern 42.

In the present embodiment, the two-layer conductive pattern is shown in a figure, but the two or more layer conductive pattern may be constructed on the mounting board 40.

The resin sealing body 15 is mounted on the mounting board 40 with the surface thereof formed of a circuit board 11 up. Therefore, the resin sealing body 15 is mounted on the mounting board 40 by adhering the main surface formed of a first sealing resin 19 to the mounting board 40 via a fixing material 45 including an insulative adhesive. The resin sealing body 15 is herein fixed on the top surface of the land pattern 43 constituted of the first conductive pattern 41 formed in a land shape pattern. This allows a heat generated from a semiconductor element 12 built in the resin sealing body 15 to be successfully released to the outside via the land pattern 43.

The sensor chip 13 and the circuit element 14 are connected to a second wiring layer 32 located on the top surface of the resin sealing body 15. Furthermore, the second wiring layer 32 of the pad shape is connected with the first conductive pattern 41 formed on the top surface of the mounting board 40 via a thin metallic wire 44. Moreover, the surface of the second wiring layer 32 with which the thin metallic wire 44 is connected is covered with a gold or silver plating.

The configuration of the semiconductor module 10A is described above. The semiconductor module 10A includes an electrode formed of the second conductive pattern 42 on the back surface thereof so that it has an advantage of being able to be surface mounted using a conductive adhesive such as a solder.

Referring to FIGS. 2 to 6, the method of manufacturing a semiconductor module 10 which is shown in FIG. 1 is described.

Figure 2A:
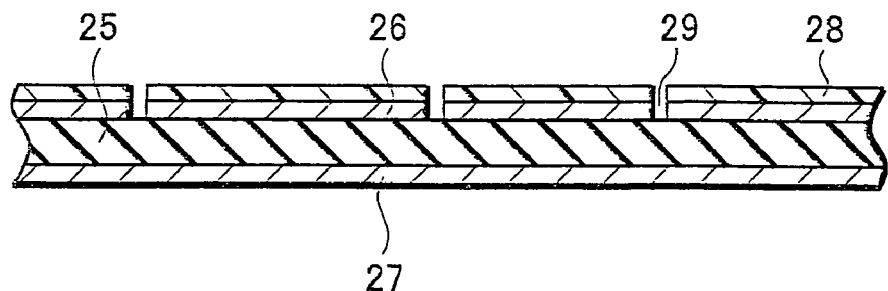
FIGS. 2A to 2D are views showing a method of manufacturing a semiconductor module according to an embodiment of the present invention.

Referring to FIG. 2A, a layered sheet which is formed by making first and second conductive films 26 and 27 stick on both surfaces of an insulative film 25 is prepared. A general resin which is employed for the printed circuit board and a flexible sheet is selected for the material of the insulative film 25. An organic filler may be mixed with the insulative film 25 taking a heat conductance into consideration. In addition, in order to improve an entire strength, the insulative film 25 may include a glass cloth or the organic filler may be mixed with the glass cloth. The thickness of the insulative film 25 can be about 50 μm.

As the material of the first and second conductive films 26 and 27, metal using copper as a major material can generally be employed. In the embodiment, a rolled copper foil is employed as the material of the first and second conductive films 26 and 27. Furthermore, the thickness of the both conductive films 26 and 27 may be about 10 µm. Both conductive films may be directly formed on the insulative film 25 by plating, evaporation, or spattering methods. Moreover, a conductive film formed by one of the methods above may be pasted on the insulative film 25.

Subsequently, a photoresist 28 is applied on the first conductive film 26 and then is shaped in a desired pattern. Thereafter, the first conductive film 26 is patterned via the photoresist 28. The surface of the insulative film 25 is then exposed in the part where the first conductive film 26 has been removed.

Figure 2B:
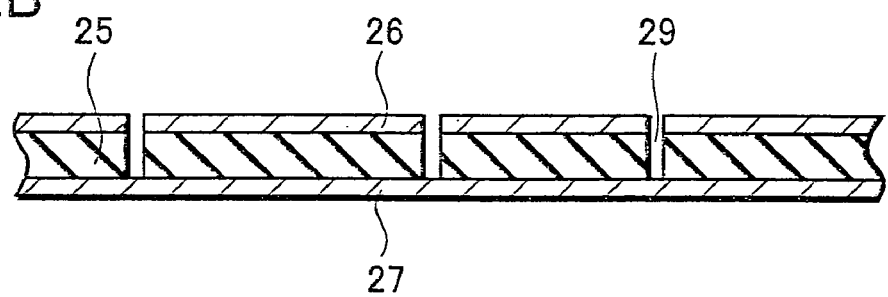

Referring to FIG. 2B, through holes 29 are formed by using the first conductive film 26 as a mask to remove the insulating film 25. Laser can be used to remove the insulating film. The removal of the insulating film 25 can be carried out by using a laser. The removal of the insulating film 25 by using the laser is carried out until the surface of the second conductive film 27 is exposed at the bottom of the through hole 29. A carbon dioxide laser is preferable as the laser herein used. In a case where there is a residue left at the bottom of the through hole 29, the residue is removed by carrying out wet-etching using sodium permanganate, ammonium persulfate or the like.

Figure 2C:
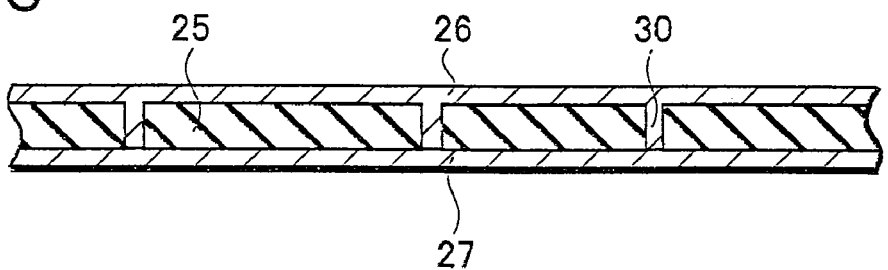

Referring to FIG. 2C, a joint 30 is formed to electrically connect the first and second conductive films 26 and 27 by carrying out a plating process. Specifically, the joint 30 is formed by forming a plating film on the entire surface of the first conductive film 26 including the through holes 29.

The plating film is formed by means of both non-electrolytic plating and electrolytic plating. A Cu plating film having a thickness of about 2 µm is formed on the entire surface of the first conductive film 26 including at least the through hole 29. This causes the first and second conductive films 26 and 27 to be electrically conductive and the Cu plating film having a thickness of about 20 µm is thus formed by carrying out electrolytic plating again using both conductive films as the electrodes. Accordingly, the through holes 29 are filled with Cu to form the joint 30. Note that it is also possible to selectively fill the through holes 29 only by carrying out filling plating.

Figure 2D:
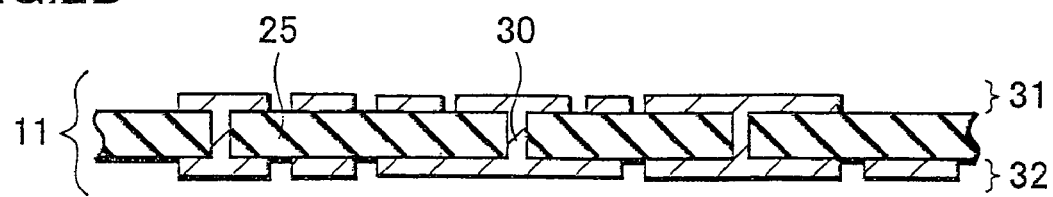

Referring to FIG. 2D, first and second wiring layers 31 and 32 are formed by etching the first and second conductive films 26 and 27 respectively, via a photoresist (not shown in the figure) patterned in a desired shape.

In this respect, the etching may not only separately be carried out on the front surface and on the back surface but also simultaneously on both surfaces. A circuit board 11 is thus formed. Alternatively, an insulative film can be formed on the top surface of the first wiring layer 31 or the second wiring layer 32, and then a conductive film can further be stacked thereon to form the circuit board 11 having a multiple layer wiring including three or more layers. The number of the wiring layers might be reduced or increased according to a specification of the semiconductor module. A plating film made of, for example, gold or silver is formed on the surface of the wiring layer. This plating film is formed at least at the point with which the thin metallic wire is connected.

Figure 3A:
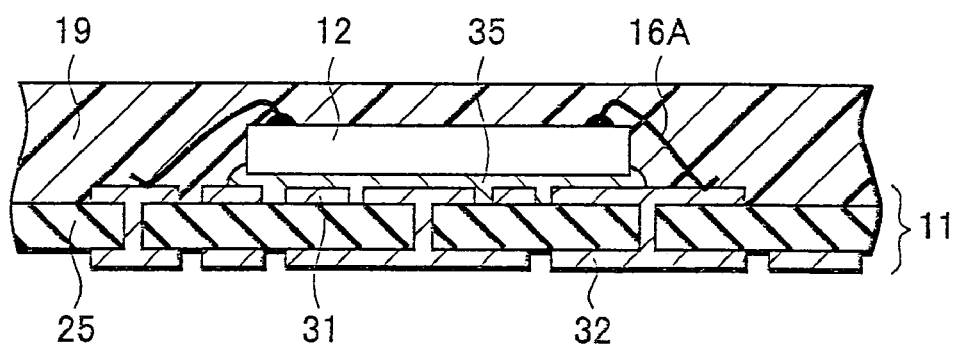
FIGS. 3A and 3B are views showing the method of manufacturing the semiconductor module according to the embodiment of the present invention.

Referring to FIG. 3A, a semiconductor element 12 is mounted on the circuit board 11, and then sealed by a first sealing resin 19. The semiconductor element 12 is fixed on the first wiring layer 31 using an adhesive material 35. Then the electrode on the semiconductor element 12 is electrically connected with the first wiring layer 31 via a thin metallic wire 16A. Thereafter, the first sealing resin 19 is formed so as to cover the semiconductor element 12 and the thin metallic wire 16A.

The fixation of the back surface of the chip to a GND may be carried out by first forming an island constituted of the first wiring layer 31 and by then adhering it using a conductive adhesive such as solder. Alternatively, the mounting can be carried out by facedown. Furthermore, the circuit may be configured of a plurality of semiconductor elements or with a combination of a semiconductor element and a passive element.

Figure 3B:
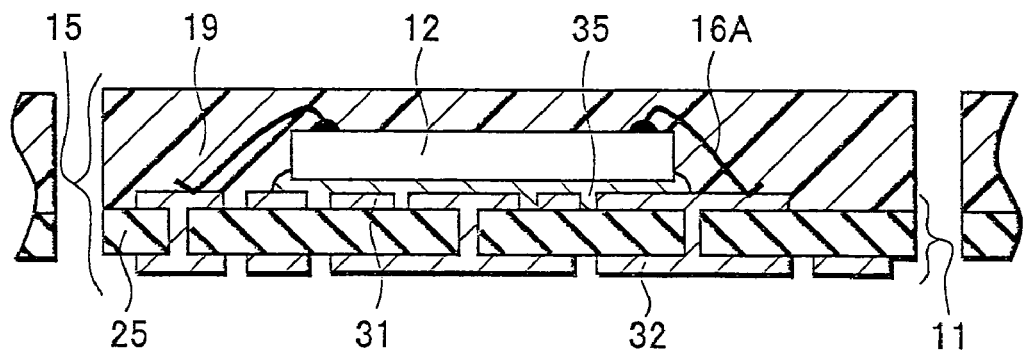

Referring to FIG. 3B, a plurality of units are collectively molded, therefore being individually separated into a resin sealing body 15 by dicing.

In the case of individual molding instead of collective molding, the separation of the circuit board 11 is carried out by dicing or the like.

Figure 4A:
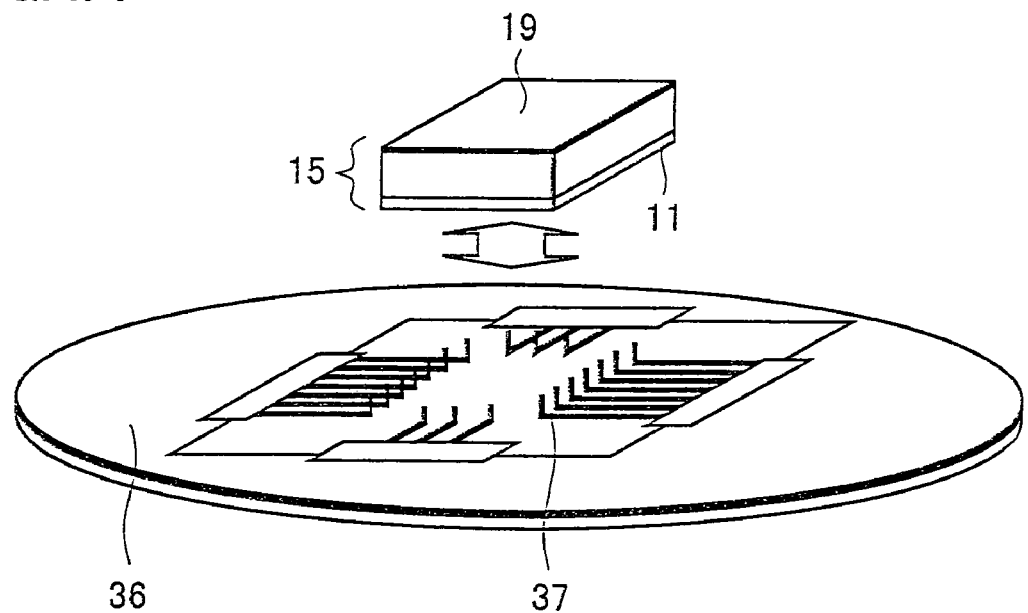
FIGS. 4A and 4B are views showing the method of manufacturing the semiconductor module according to the embodiment of the present invention.

Referring to FIG. 4A, a probe card 36 is abutted to the electrode exposed from the resin sealing body 15 to measure the electrical properties of the semiconductor element 12. A probe 37 is positioned so as to be aligned with the second wiring layer 32 formed on the circuit board 11. The probe 37 judges whether the semiconductor element 12 built in the resin sealing body 15 is good or not. The only resin sealing body 15 which has been judged good is processed subsequently to this process.

The semiconductor module according to the present embodiment is a double-sided surface mount type. All functions of the semiconductor element 12 can be checked through the inspection carried out at the stage of mounting the parts including the semiconductor element 12 on the first wiring layer 31. Moreover, the thin metallic wire 16A can be prevented from being broken due to the contact with the outside at the stage of the inspection or in the process of mounting the sensor because the parts mounted on the side of the first wiring layer 31 are resin-sealed. Thus, the reliability can be maintained in the following processes.

Figure 4B:
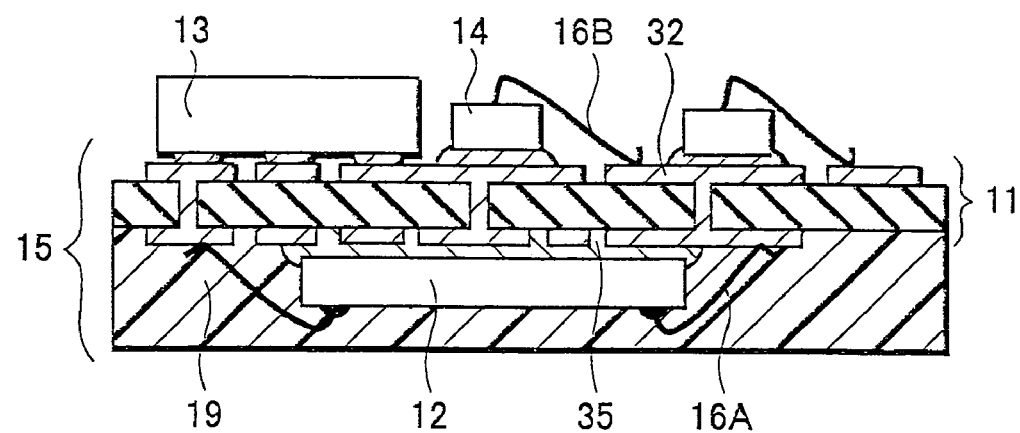

Referring to FIG. 4B, the resin sealing body 15 is inverted to electrically connect and mount a sensor chip 13 and a circuit element 14 on the second wiring layer 32. In this process, the sensor chip 13 and the like are mounted only on the resin sealing body 15 which has been judged good because the resin sealing body 15 judged not good in the previous process is discarded. Accordingly, it makes possible to prevent the sensor chips 13 from unnecessarily being mounted although sensors without any problems have so far been discarded because of judging whether the semiconductor element is good or not is carried out after the sensors have been mounted. As a result, the manufacturing cost can be reduced. In addition, as described above, the semiconductor element 12 mounted on the back surface and the thin metallic wire 16A are resin-sealed so that the thin metallic wire 16A is prevented from being broken and short-circuited due to the contact thereof with the outside when mounting the sensor chip 13 and the circuit element 14.

Figure 5A:
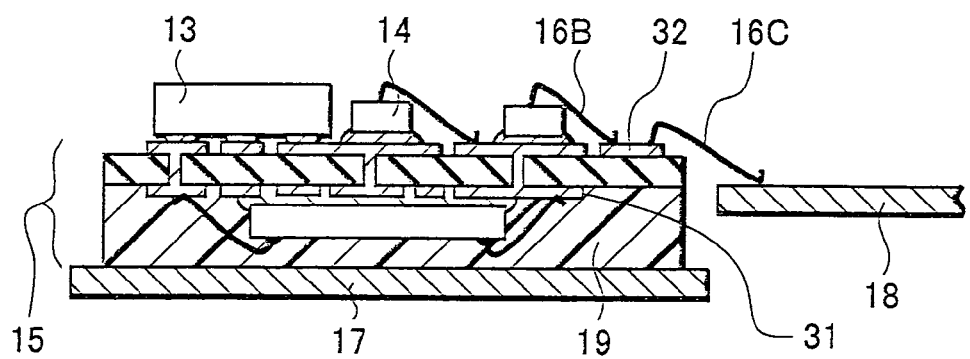
FIGS. 5A and 5B are views showing the method of manufacturing the semiconductor module according to the embodiment of the present invention.

Referring to FIG. 5A, the resin sealing body 15 on which the sensor chip 13 and the circuit element 14 are mounted is mounted on an island 17. Then, leads 18 exchanging electrical signals with the outside are electrically connected with the second wiring layer 32 via a thin metallic wire 16C. As shown in FIG. 5A, the resin sealing body 15 is mounted on the island 17 with the front surface of the first sealing resin 19 down. The planar size of the island 17 may be either larger or smaller than that of the bottom of the resin sealing body 15. The first sealing resin 19 is thin in thickness so that a heat generated from the semiconductor element 12 can be released from the island 17.

Figure 5B:
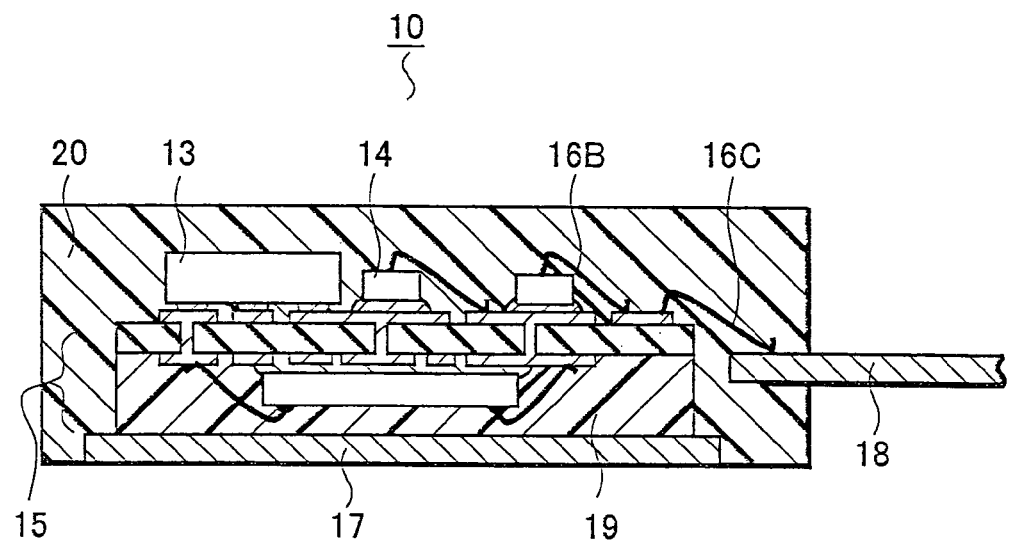

Referring to FIG. 5B, the resin sealing body 15 is integrally sealed by a second sealing resin 20 such that one end of the lead 18 is exposed to the outside. The other end of the lead 18 thus is embedded into the second sealing resin 20. The back surface of the island 17 can be exposed from the second sealing resin 20 taking heat releasing properties into consideration.

As described above, in the present embodiment, the resin sealing body 15 which is a package having a previously insured reliability is employed, and then the sensor chip 13 and the circuit element 14 are further mounted on the back surface of the package to be molded, whereby a highly reliable module is obtained. The resin sealing body 15 may be an SIP, and the sensor chip 13 and the circuit element 14 are further mounted on the electrode located on the back surface thereof, thereby planar and steric placements becoming possible. Therefore, a highly functional down-sized SIP can be realized.

The island 17 takes a role in releasing the heat generated from the package (the resin sealing body 15) including the elements mounted on the back surface thereof. In particular, the sensor chip 13 which is one of the sensors having properties which vary or deteriorate due to the heat can be protected from the heat by the heat releasing function of the island 17.

Moreover, since the leads 18 are employed, the sensor chip 13 can be vertically disposed with respect to a mounting board (not shown in the figure) by inserting the leads 18 into the mounting board. Furthermore, the sensor chip 13 can be horizontally disposed with respect to the mounting board by folding the leads 18. These are effective for the sensor chip 13 which is mounted on the semiconductor module 10 to detect vibrations in horizontal and vertical directions.

Referring to FIG. 6, a method of manufacturing the semiconductor module 10A which is shown in FIG. 1B is described. In this method, the processes used until a resin sealing body 15 which is a package is manufactured and inspected are the same as those describe above.

Figure 6A:
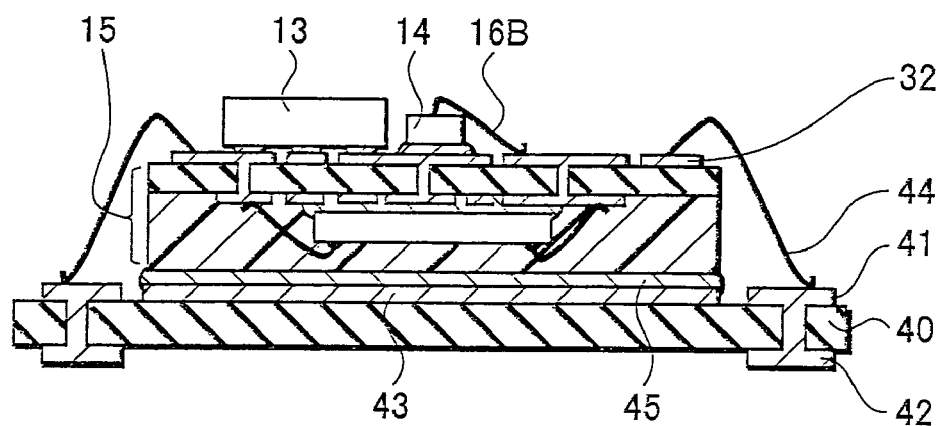
FIGS. 6A and 6B are views showing the method of manufacturing the semiconductor module according to the embodiment of the present invention.

Referring to FIG. 6A, the resin sealing body 15 is first mounted on the top surface of a mounting board 40 to then be connected. On the top and under surfaces of the mounting board 40, first and second conductive patterns 41 and 42 which are patterned in the predetermined shape are formed.

The resin sealing body 15 is fixed to a land pattern 43 formed on the surface of the mounting board 40 using a fixing agent 45 made of an insulative adhesive. Thereafter, a sensor chip 13 and a circuit element 14 are mounted on a second wiring layer 32 exposed on the top surface of the resin sealing body 15. Furthermore, the circuit element 14 is electrically connected with the second wiring layer 32 using a thin metallic wire 16B. At this stage, the resin sealing body 15 on which the sensor chip 13 and the like are previously mounted may be fixed on the mounting board 40.

Furthermore, the second wiring layer 32 corresponding to the bonding pad is also formed around the top surface of the resin sealing body 15. The second wiring layer 32 is electrically connected with the first conductive pattern 41 formed on the top surface of the mounting board 40 via a thin metallic wire 44.

Figure 6B:
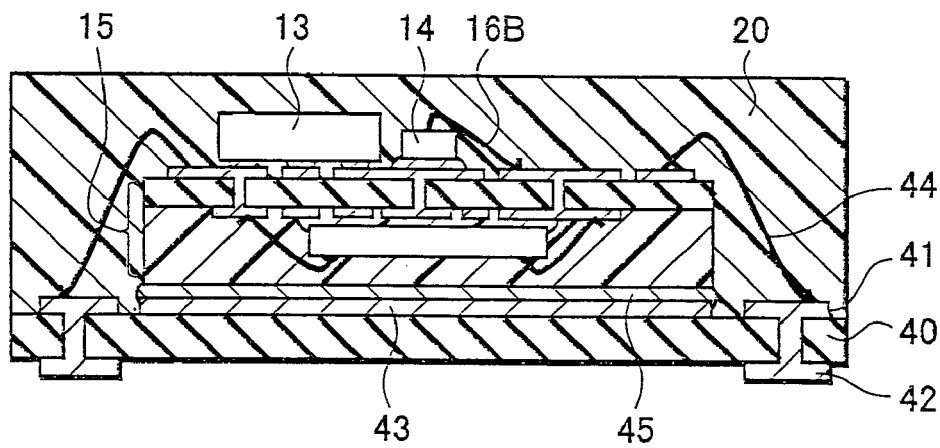
Figure 7A:
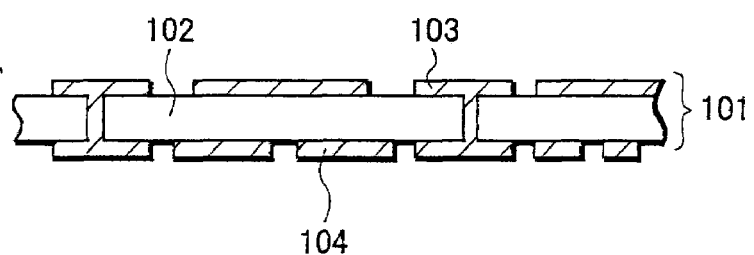
FIGS. 7A to 7C are views showing a conventional method of manufacturing a circuit module.
Figure 7B:
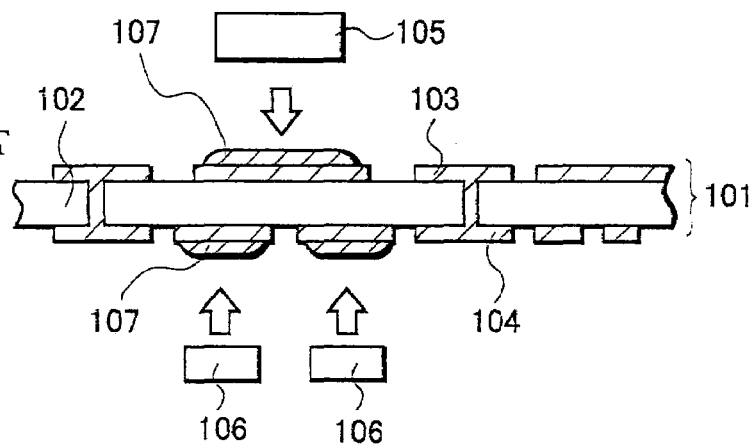
Figure 7C:
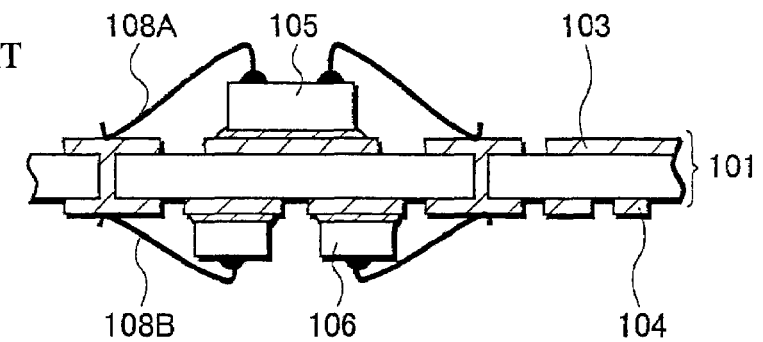

Referring to FIG. 6B, a second sealing resin 20 is subsequently formed on the surface of the mounting board 40 such that the resin sealing body 15, the sensor chip 13, the circuit element 14, and thin metallic wire 44 are covered. As a method of forming the second sealing resin 20, transfer molding, injection molding, potting or the like can be employed. Moreover, as necessary, a solder electrode and the like might be fixed on the back surface of the second conductive pattern 42. Furthermore, the photoresist might be applied on the back surface of the mounting board 40 such as to cover the second conductive pattern 42 except for the area in which the solder electrode is deposited.

The processes described above are used to manufacture the semiconductor module 10A, the structure of which is shown in FIG. 1B.

In the semiconductor module according to the embodiment of the present invention, the resin sealing body in which the semiconductor elements are built-in is further sealed by a sealing resin. For example, in a case where a drive circuit for driving a sensor is mounted in an SIP as a semiconductor element, the semiconductor element which serves as a key device is further sealed by the second sealing resin for a double protection. Therefore, a very highly reliable semiconductor module is obtained. Furthermore, excellent heat releasing properties can be realized since the resin sealing body is mounted on the island.

In addition, in the method of manufacturing the semiconductor module according to the embodiment of the present invention, a sensor is mounted after the semiconductor elements are mounted on the circuit board and then sealed using a resin. Accordingly, at the time of mounting the sensor, the semiconductor elements can be protected from the outside using a mold resin. For example, the thin metallic wires can be prevented from being broken even if the semiconductor elements have been mounted using the thin metallic wires. Thus, the highly reliable semiconductor module can be provided.

Also, the sensor is mounted after the semiconductor element is inspected as a single unit for checking its electrical properties. Accordingly, the sensor can be connected with a good semiconductor element so that the waste of the sensor is eliminated.

What is claimed is:

1. A semiconductor module comprising:
   an island formed of a conductive material;
   a semiconductor element;
   a resin sealing body which is mounted on the island and arranged such that a back surface of a circuit board on which the semiconductor element is mounted faces upward;
   a plurality of leads electrically connected to the semiconductor element;
   a sensor which is mounted on the back surface of the circuit board and electrically connected to the semiconductor element via a conductive material penetrating the circuit board;
   a conductive connection which electrically connects the circuit board with the leads; and
   a sealing resin that seals the island, the resin sealing body, the sensor, and parts of the leads.

2. The semiconductor module according to claim 1, wherein a back surface of the island is exposed from the sealing resin.

3. The semiconductor module according to claim 1, wherein the sensor is electrically connected by an adhesive to a wiring layer on the mounting board.

4. The semiconductor module according to claim 1, wherein a circuit element is mounted on the back surface of the circuit board.

5. A semiconductor module comprising:
   a mounting board having at least an external connection electrode and a pad electrode electrically connected with the external connection electrode;

a semiconductor element:
a resin sealing body which is disposed on the mounting board and is arranged such that a back surface of a circuit board on which the semiconductor element is mounted faces upward;
a sensor which is mounted on the back surface of the circuit board and electrically connected to the semiconductor element via a conductive material penetrating the circuit board;
a conductive connection which is used to electrically connect an electrode exposed on the back surface of the circuit board with the pad electrode of the mounting board; and
a sealing resin which seals a surface of the mounting board, the resin sealing body, the sensor and the conductive connection.

6. The semiconductor module according to claim 5, wherein a land pattern is on the surface of the mounting board to fix the resin sealing body.

7. The semiconductor module according to one of claims 1 and 5, wherein the sensor is operable to detect displacement, transfer, pressure, gravity, earth magnetism, impact, temperature, velocity, acceleration, or angular velocity.

8. The semiconductor module according to claim 5, wherein the sensor is electrically connected by an adhesive to a wiring layer on the mounting board.

9. The semiconductor module according to claim 5, wherein a circuit element is mounted on the back surface of the circuit board.

* * * * *